(12) United States Patent
Koyama

(10) Patent No.: US 8,502,298 B2
(45) Date of Patent: Aug. 6, 2013

(54) SEMICONDUCTOR DEVICE AND METHOD OF MANUFACTURING THE SAME

(75) Inventor: Haruhiko Koyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 79 days.

(21) Appl. No.: 13/053,849

(22) Filed: Mar. 22, 2011

(65) Prior Publication Data

US 2012/0037974 A1     Feb. 16, 2012

(30) Foreign Application Priority Data

Aug. 16, 2010  (JP) .................................. 2010-181625

(51) Int. Cl.
*H01L 29/788*      (2006.01)

(52) U.S. Cl.
USPC ......................................................... 257/316

(58) Field of Classification Search
USPC .............. 257/314–316, 536, E29.3, E27.097, 257/E27.101, E27.102, 319
See application file for complete search history.

(56) References Cited

U.S. PATENT DOCUMENTS

| | | | | |
|---|---|---|---|---|
| 6,518,642 | B2 * | 2/2003 | Kim et al. | 257/528 |
| 6,667,507 | B2 * | 12/2003 | Shirota et al. | 257/315 |
| 6,713,834 | B2 * | 3/2004 | Mori et al. | 257/510 |
| 6,781,193 | B2 * | 8/2004 | Lee et al. | 257/326 |
| 6,856,581 | B1 * | 2/2005 | Berstis et al. | 368/121 |
| 6,921,960 | B2 * | 7/2005 | Ichige et al. | 257/532 |
| 7,442,985 | B2 * | 10/2008 | Ichige et al. | 257/315 |
| 7,663,178 | B2 * | 2/2010 | Arai et al. | 257/315 |
| 7,772,084 | B2 * | 8/2010 | Bez et al. | 438/425 |
| 7,906,816 | B2 * | 3/2011 | Sugimae et al. | 257/379 |
| 8,044,450 | B2 * | 10/2011 | Noguchi et al. | 257/316 |
| 8,088,661 | B2 * | 1/2012 | Arai et al. | 438/270 |
| 2002/0167843 | A1 * | 11/2002 | Hsia et al. | 365/185.28 |
| 2004/0185618 | A1 * | 9/2004 | Yaegashi et al. | 438/257 |
| 2006/0033151 | A1 * | 2/2006 | Shirota et al. | 257/316 |
| 2006/0054953 | A1 * | 3/2006 | Son et al. | 257/296 |
| 2007/0267685 | A1 * | 11/2007 | Ishibashi | 257/316 |
| 2008/0102575 | A1 * | 5/2008 | Kim | 438/232 |
| 2009/0067256 | A1 * | 3/2009 | Bhattacharyya et al. | 365/185.28 |
| 2009/0236653 | A1 * | 9/2009 | Kikuchi et al. | 257/321 |
| 2009/0267177 | A1 * | 10/2009 | Ide et al. | 257/516 |
| 2010/0065900 | A1 * | 3/2010 | Murata et al. | 257/314 |
| 2011/0217817 | A1 * | 9/2011 | Kim | 438/238 |

FOREIGN PATENT DOCUMENTS

| | | | |
|---|---|---|---|
| JP | 2001-313375 | | 11/2001 |
| JP | 2004-363329 | | 12/2004 |
| KR | 2007070870 A | * | 7/2007 |

* cited by examiner

*Primary Examiner* — Hsien Ming Lee
*Assistant Examiner* — Michele Fan
(74) *Attorney, Agent, or Firm* — Oblon, Spivak, McClelland, Maier & Neustadt, L.L.P.

(57) ABSTRACT

In one embodiment, a semiconductor device includes a resistor element and a stacked-gate type memory cell transistor. The resistor element includes a first conductive layer which is formed on a second conductive layer via a first insulating layer, and is electrically connected to an interconnect, the second conductive layer being on a substrate and in a floating state. The stacked-gate type memory cell transistor is on the substrate, and includes a floating gate formed of the same material as the second conductive layer.

9 Claims, 18 Drawing Sheets

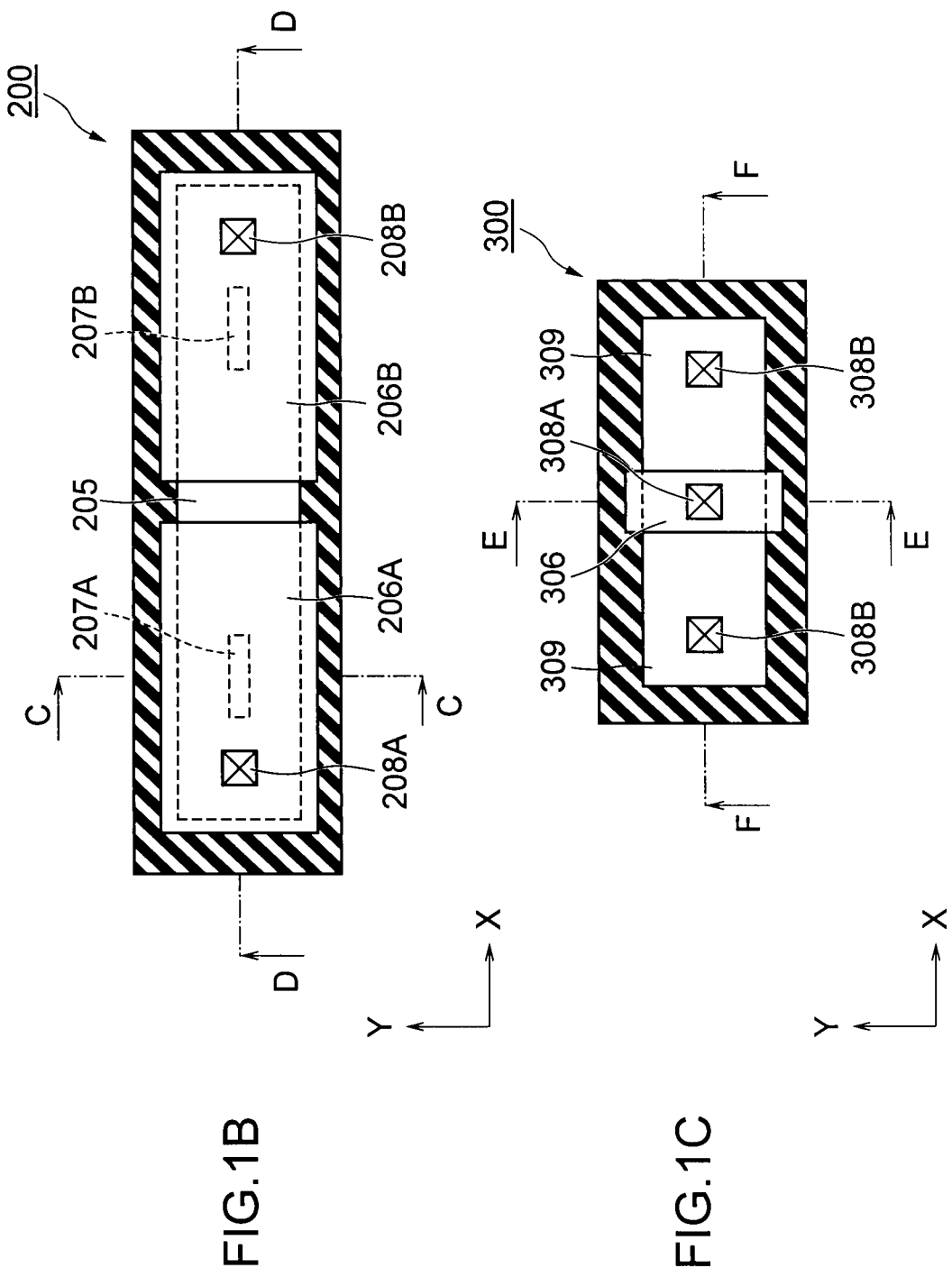

US 8,502,298 B2

SEMICONDUCTOR DEVICE AND METHOD OF MANUFACTURING THE SAME

CROSS REFERENCE TO RELATED APPLICATION

This application is based upon and claims the benefit of priority from the prior Japanese Patent Application No. 2010-181625, filed on Aug. 16, 2010, the entire contents of which are incorporated herein by reference.

FIELD

Embodiments described herein relate to a semiconductor device and a method of manufacturing the same.

BACKGROUND

Conventionally, a floating gate of a cell transistor of a NAND flash memory and a resistive part of a resistor element in a peripheral circuit are formed of polysilicon films of the same thickness and same material according to a known technique.

However, according to such a technique, the thickness of the floating gate and the thickness of the resistive part become the same. Therefore, when the thickness of the floating gate is set to be large in order to increase a coupling ratio between the floating gate and a control gate, the thickness of the resistive part also becomes large.

Therefore, to prevent the resistance of the resistor element from decreasing, it is required to change the layout of the resistor element. Specifically, it is required to increase the length of the resistive part. However, this results in the increase of the area of the resistor element, and makes it difficult to miniaturize the circuit.

BRIEF DESCRIPTION OF THE DRAWINGS

FIGS. 1A to 1C show top views of a non-volatile memory element, a resistor element, and a transistor included in a semiconductor device according to a first embodiment, respectively;

DETAILED DESCRIPTION

Embodiments will now be explained with reference to the accompanying drawings.

An embodiment described herein is a semiconductor device including a resistor element and a stacked-gate type memory cell transistor. The resistor element includes a first conductive layer which is formed on a second conductive layer via a first insulating layer, and is electrically connected to an interconnect, the second conductive layer being on a substrate and in a floating state. The stacked-gate type memory cell transistor is on the substrate, and includes a floating gate formed of the same material as the second conductive layer.

Another embodiment described herein is a method of manufacturing a semiconductor device. The method includes forming a first film on a substrate, a second film on the first film, and a third film on the second film. The method further includes etching the third film into a first conductive layer included in a resistor element, and an upper gate electrode of a stacked-gate type memory cell transistor. The method further includes etching the second film into a first insulating layer under the first conductive layer, and a second insulating layer under the upper gate electrode. The method further includes etching the first film into a second conductive layer under the first insulating layer, and a floating gate under the second insulating layer. The method further includes forming an interconnect on the first conductive layer.

First Embodiment

Configuration of Semiconductor Device

Figure 1A:
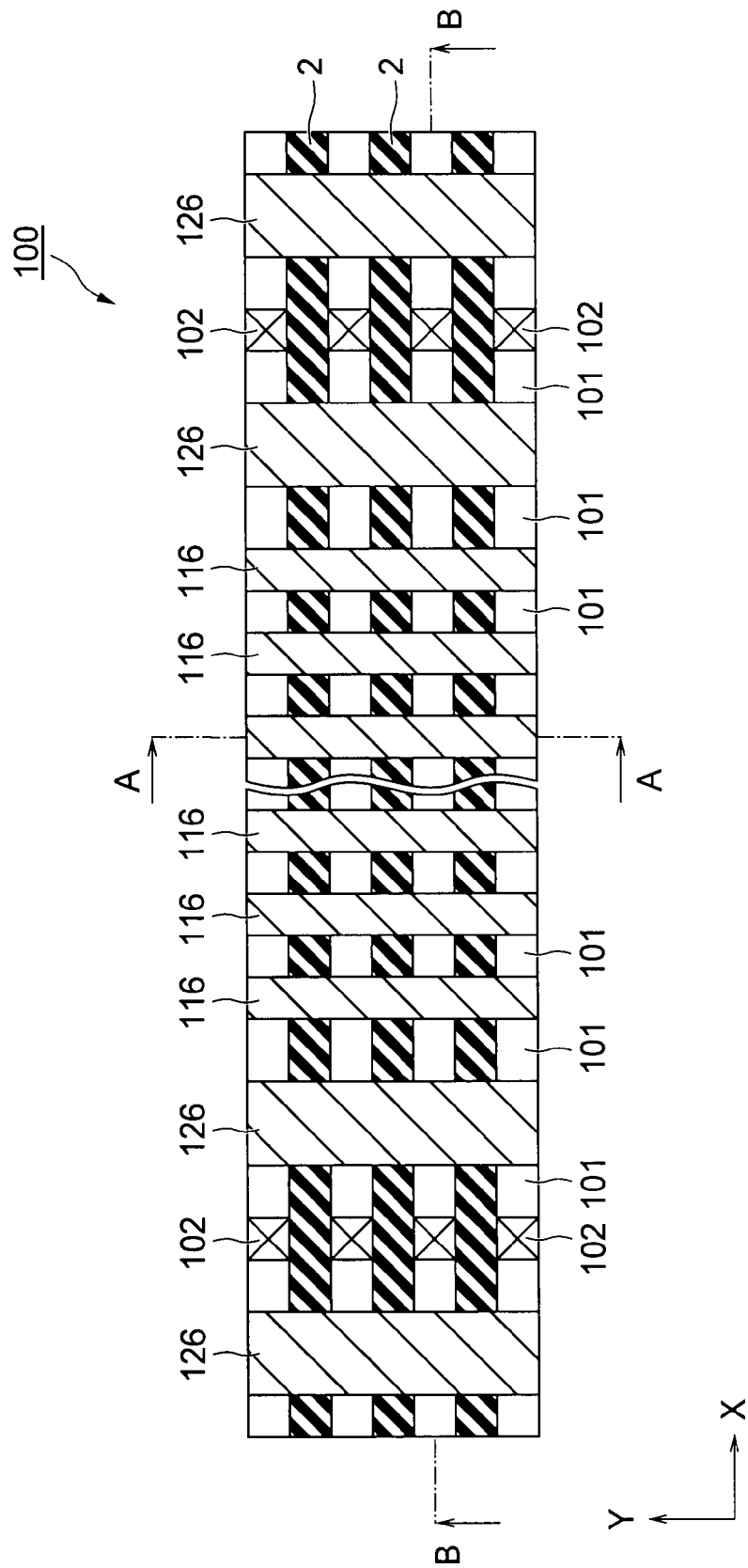

FIGS. 1A to 1C show top views of a non-volatile memory element 100, a resistor element 200, and a transistor 300 included in a semiconductor device according to a first embodiment, respectively.

Figure 2A:
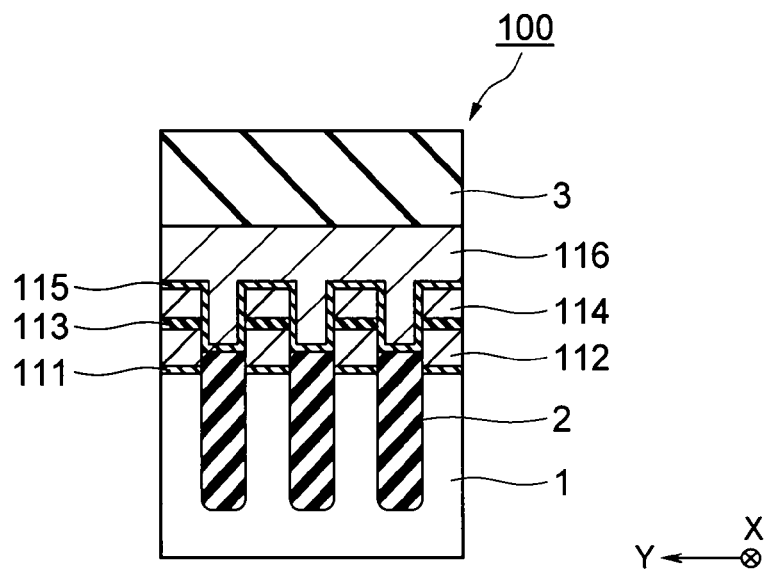
FIG. 2A shows a side sectional view of the non-volatile memory element taken along a line A-A in FIG. 1A.
Figure 2B:
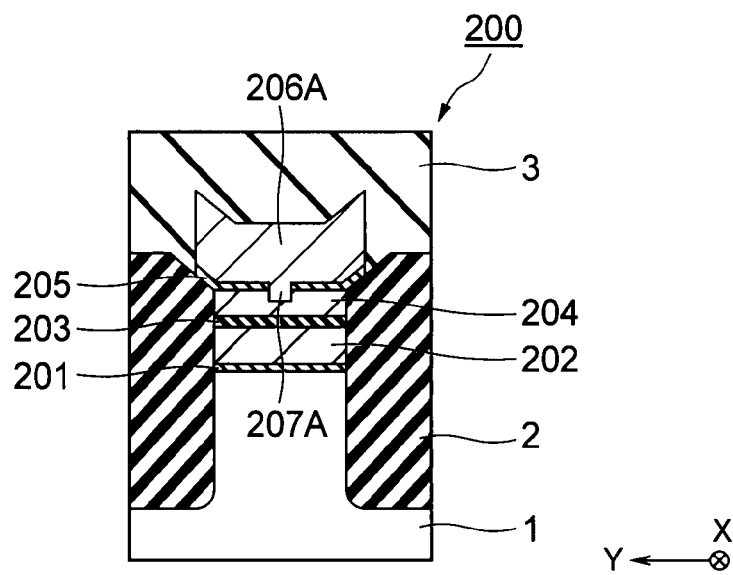
FIG. 2B shows a side sectional view of the resistor element taken along a line C-C in FIG. 1B.
Figure 2C:
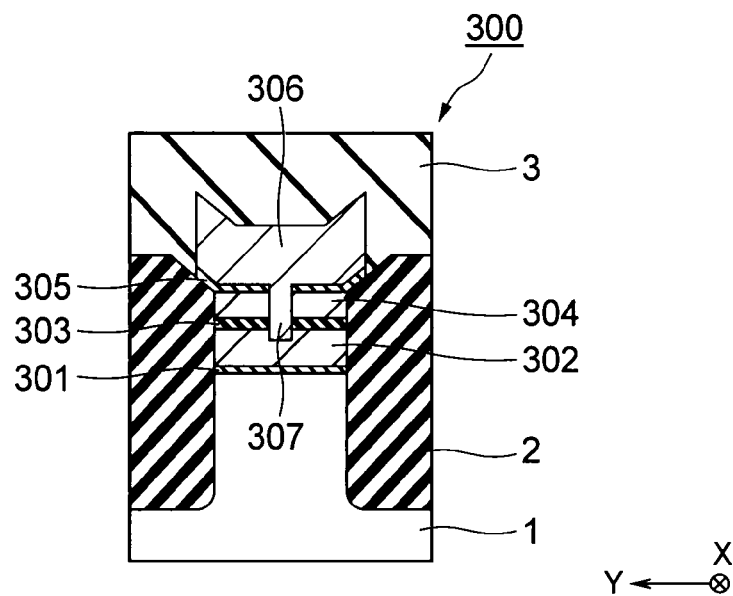
FIG. 2C shows a side sectional view of the transistor taken along a line E-E in FIG. 1C.

FIGS. 2A to 2C show a side sectional view of the non-volatile memory element 100 taken along a line A-A in FIG. 1A, a side sectional view of the resistor element 200 taken along a line C-C in FIG. 1B, and a side sectional view of the transistor 300 taken along a line E-E in FIG. 1C, respectively.

Figure 3A:
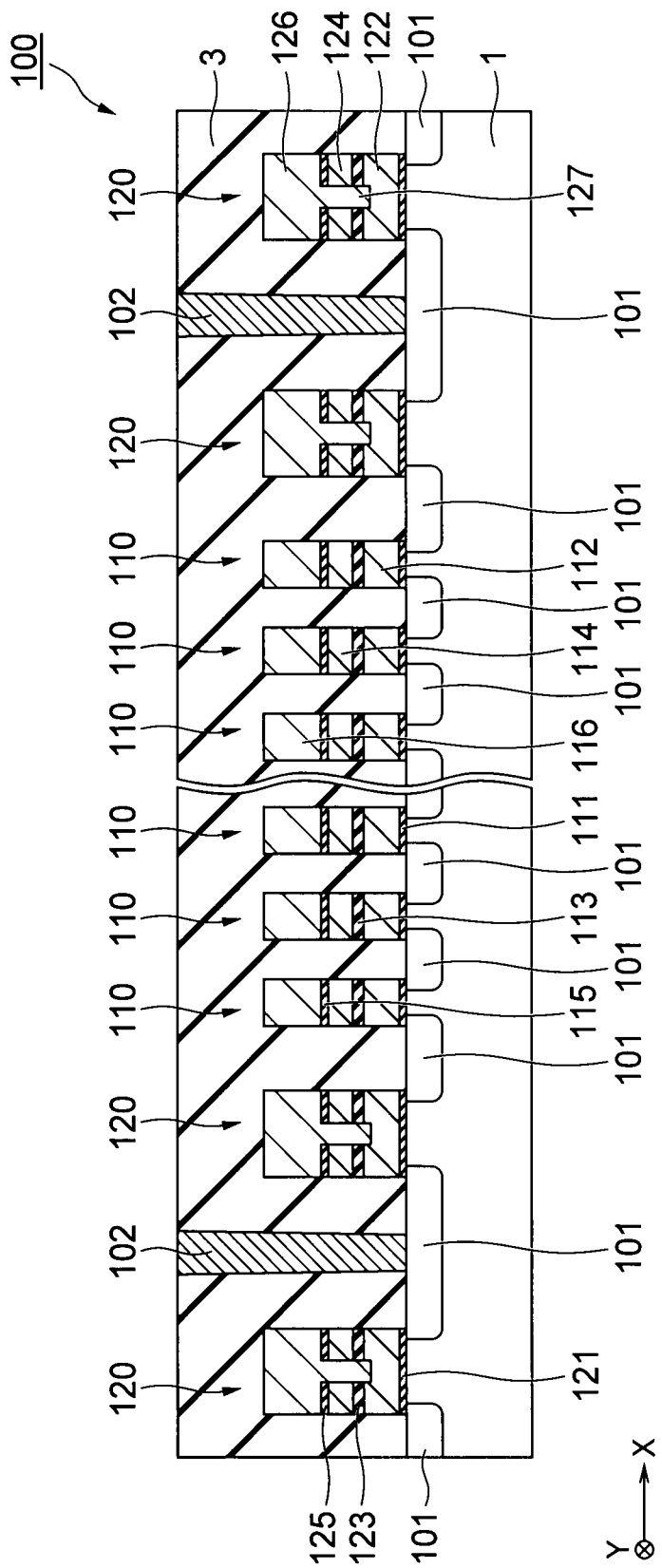
FIG. 3A shows a side sectional view of the non-volatile memory element taken along a line B-B in FIG. 1A.
Figure 3B:
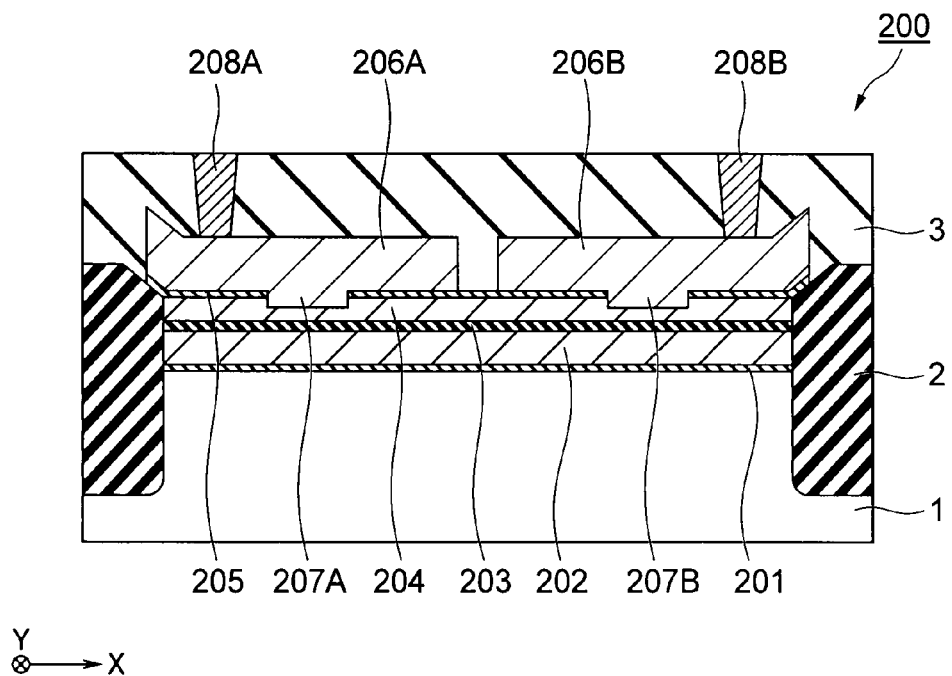
FIG. 3B shows a side sectional view of the resistor element taken along a line D-D in FIG. 1B.
Figure 3C:
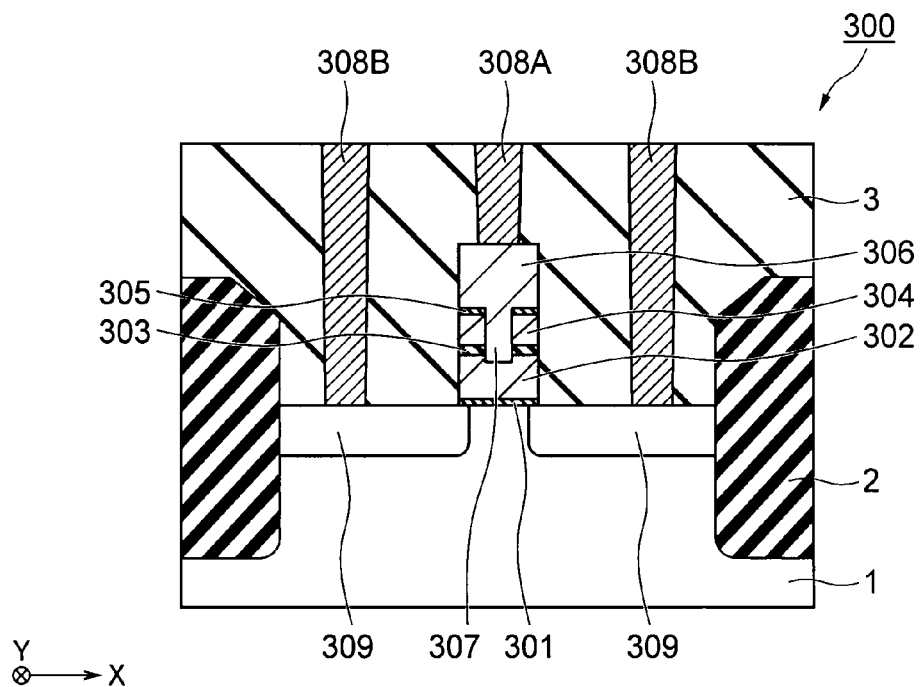
FIG. 3C shows a side sectional view of the transistor taken along a line F-F in FIG. 1C.

FIGS. 3A to 3C show a side sectional view of the non-volatile memory element 100 taken along a line B-B in FIG. 1A, a side sectional view of the resistor element 200 taken along a line D-D in FIG. 1B, and a side sectional view of the transistor 300 taken along a line F-F in FIG. 1C, respectively.

The semiconductor device according to the present embodiment includes the non-volatile memory element 100, the resistor element 200, and the transistor 300 formed on a semiconductor substrate 1. The non-volatile memory element 100 is a NAND memory element including a stacked-gate type cell transistor. The resistor element 200 and the transistor 300 are circuit elements formed in a peripheral circuit region.

The non-volatile memory element 100, the resistor element 200, and the transistor 300 are formed on element areas in the semiconductor substrate 1. The elements areas are separated by isolation insulators 2. An insulating layer 3 called inter layer dielectric is formed on the non-volatile memory element 100, the resistor element 200, and the transistor 300.

The non-volatile memory element 100 includes a plurality of stacked-gate type memory cell transistors 110 connected in series via source and drain regions 101 in the X direction in the figures, and select gate transistors 120 connected via the source and drain regions 101 at both ends of the plurality of memory cell transistors 110. The X direction may be referred to as a bit line direction. The Y direction may be referred to as a word line direction.

A contact plug 102 is connected to a source or drain region 101 which connects two adjacent select gate transistors 120. The contact plug 102 is connected to a bit line or a source line (not shown) in an upper layer.

Each of the memory cell transistors 110 includes a tunnel insulator 111 on the semiconductor substrate 1, a floating gate 112 on the tunnel insulator 111, an IFD (Inter Floating-Gate Dielectric) film 113 on the floating gate 112, an upper gate electrode 114 on the IFD film 113, an IPD (Inter Poly-Si Dielectric) film 115 on the upper gate electrode 114, and a control gate 116 on the IPD film 115.

In the Y direction in the figures, the IPD film 115 is continuously formed between adjacent memory cell transistors 110. Specifically, the IPD film 115 is continuously formed on the top surface of the upper gate electrode 114, on the side surfaces of the upper gate electrode 114 and the IFD film 113, on the upper side surfaces of the floating gate 112, and on the top surfaces of the floating gate 112 and the isolation insulators 2. In this way, the IPD film 115 is formed on the side surfaces of the upper gate electrode 114 and the upper side surfaces of the floating gate 112, so that the coupling ratio can be large.

The tunnel insulator 111 functions as an FN (Fowler-Nordheim) tunnel film. The FN tunnel film is an insulating layer having a thickness in which charge transmission by FN tunneling is dominant. The thickness of the tunnel insulator 111 is greater than or equal to 3 nm in EOT (Equivalent Oxide Thickness), i.e., in thickness of silicon oxide film. It is preferable that the thickness of the tunnel insulator 111 is 7 to 8 nm in EOT so that no charge is transmitted except the time for a write operation or an erase operation.

The floating gate 112 functions as a film for storing charges.

The IFD film 113 of the present embodiment functions as a film for blocking charges from passing from the floating gate 112 to the upper gate electrode 114. It is preferable that the thickness of the IFD film 113 is greater than that of the tunnel insulator 111 in EOT, for example. In the present embodiment, the thickness of the IFD film 113 in physical thickness is also greater than the thickness of the tunnel insulator 111 in physical thickness.

The upper gate electrode 114 has the same pattern as that of the floating gate 112. The movement of charges from the floating gate 112 to the upper gate electrode 114 is blocked by the IFD film 113, so that charges are hardly stored in the upper gate electrode 114. A role of the memory cell transistor 110 as a charge storage film is mainly played by the floating gate 112.

The IPD film 115 functions as a film for blocking charges injected into the floating gate 112 from passing to the control gate 116.

The control gate 116 is formed to commonly connect the memory cell transistors 110 adjacent in the Y direction and configures a word line. The control gate 116 functions as an electrode for controlling the memory cell transistors 110.

When writing data to or reading data from the non-volatile memory element 100, a memory cell transistor (selected cell) to which the data is written or from which the data is read is selected from the memory cell transistors 110 arranged in an array form, and predetermined voltages are respectively applied to the selected cell and non-selected cells. When the data is written to the selected cell, charges are injected from the semiconductor substrate 1 to the floating gate 112 of the selected cell and stored.

In the memory cell transistor 110, the IPD film 115 is in contact with the upper side surface of the floating gate 112. Therefore, when a voltage is applied to the control gate 116, charges pass through the tunnel insulator 111 from the semiconductor substrate 1, and the charges are stored in the floating gate 112. The IFD film 113 and the upper gate electrode 114 are disposed on the floating gate 112, and thereby it is possible to effectively prevent charges from passing from the floating gate 112 to the control gate 116.

Each of the select gate transistors 120 includes a gate insulator 121 on the semiconductor substrate 1, a lower layer electrode 122 on the gate insulator 121, an insulating layer 123 on the lower layer electrode 122, a middle layer electrode 124 on the insulating layer 123, an insulating layer 125 on the middle layer electrode 124, and an upper layer electrode 126 on the insulating layer 125.

The upper layer electrode 126, the middle layer electrode 124, and the lower layer electrode 122 are electrically connected to each other via a connection part 127 of the upper layer electrode 126, and function as a select gate electrode. The bottom part of the connection part 127 is located in the lower layer electrode 122.

FIGS. 1B, 2B and 3B show an insulating layer 201 on the semiconductor substrate 1, a second conductive layer 202 on the insulating layer 201, and an insulating layer 203 on the second conductive layer 202. The resistor element 200 includes a first conductive layer 204 on the insulating layer 203, an insulating layer 205 on the first conductive layer 204, and electrodes 206A and 206B on the insulating layer 205. Further, contact plugs 208A and 208B are electrically connected to the electrodes 206A and 206B, respectively.

The contact plugs 208A and 208B are electrically connected to interconnects in an upper layer (not shown) respectively, and a current flows between these interconnects via the first conductive layer 204 and the electrodes 206A and 206B which are electrically connected to the contact plugs 208A and 208B. The first conductive layer 204 functions as a resistor. The electrode 206A and the first conductive layer 204 are electrically connected to each other via a connection part 207A of the electrode 206A. The bottom parts of the connection parts 207A and 207B are located in the first conductive layer 204. The bottom parts of the connection parts 207A and 207B may be in contact with the upper surface of the insulating layer 203, or may be located in the insulating layer 203. In other words, the connection parts 207A and 207B only has to be detached from the second conductive layer 202. Further, the bottom parts of the connection parts 207A and 207B are located in a position higher than the bottom part of the connection part 127. The electrode 206B and the first conductive layer 204 are electrically connected to each other via the connection part 207B of the electrode 206B. On the other hand, the second conductive layer 202 is electrically insulated from the first conductive layer 204, and is in a floating state in which the second conductive layer 202 is electrically insulated from the interconnects in the upper layer. Therefore, the second conductive layer 202 does not function as a resistor.

The transistor 300 includes a gate insulator 301 on the semiconductor substrate 1, a lower layer electrode 302 on the gate insulator 301, an insulating layer 303 on the lower layer electrode 302, a middle layer electrode 304 on the insulating layer 303, an insulating layer 305 on the middle layer electrode 304, an upper layer electrode 306 on the insulating layer 305, and source and drain regions 309 at both sides of the gate insulator 301 in the semiconductor substrate 1. Contact plugs 308A and 308B are electrically connected to the upper layer electrode 306 and the source and drain regions 309, respectively.

The upper layer electrode 306, the middle layer electrode 304, and the lower layer electrode 302 are electrically connected to each other via a connection part 307 of the upper layer electrode 306, and function as a gate electrode. The bottom part of the connection part 307 is located in the lower layer electrode 302. The bottom part of the connection part 307 is located at approximately the same level as the bottom part of the connection part 127.

The semiconductor substrate 1 is formed of an Si-based crystal, for example.

The isolation insulators 2 are formed of insulating material such as oxide silicon, and for example, has STI (Shallow Trench Isolation) structures.

The insulating layer 3 is formed of insulating material such as oxide silicon.

The tunnel insulator 111 of the memory cell transistor 110, the gate insulator 121 of the select gate transistor 120, and the gate insulator 301 of the transistor 300 are formed of the same material and have approximately the same thickness. Although not shown in the figures, the non-volatile memory element 100 may have a transistor (hereinafter referred to as "high-voltage transistor") whose driving voltage is higher than that of the transistor 300. The gate insulator of the high-voltage transistor may have a thickness different from that of the tunnel insulator 111 and the gate insulator 121.

The insulating layer 201 of the resistor element 200 is, for example, a silicon oxide film. It is preferable that the insulating layer 201 has a thickness larger than that of the tunnel insulator 111, the gate insulator 121, and the gate insulator 301 because the insulating layer 201 is required to have a sufficient thickness for preventing charges from passing to the semiconductor substrate 1 by a voltage applied to the first conductive layer 204 of the resistor element 200. The insulating layer 201 and the gate insulator of the high-voltage transistor may be formed of the same material and have approximately the same thickness.

The floating gate 112 of the memory cell transistor 110, the lower layer electrode 122 of the select gate transistor 120, the second conductive layer 202 of the resistor element 200, and the lower layer electrode 302 of the transistor 300 are formed by patterning a polysilicon film or the like formed at the same time, so that they are formed of the same material and have approximately the same thickness.

The IFD film 113 of the memory cell transistor 110, the insulating layer 123 of the select gate transistor 120, the insulating layer 203 of the resistor element 200, and the insulating layer 303 of the transistor 300 are formed by patterning a silicon oxide film or the like formed at the same time, so that they are formed of the same material and have approximately the same thickness.

The upper gate electrode 114 of the memory cell transistor 110, the middle layer electrode 124 of the select gate transistor 120, the first conductive layer 204 of the resistor element 200, and the middle layer electrode 304 of the transistor 300 are formed by patterning a polysilicon film or the like formed at the same time, so that they are formed of the same material and have approximately the same thickness.

The IPD film 115 of the memory cell transistor 110, the insulating layer 125 of the select gate transistor 120, the insulating layer 205 of the resistor element 200, and the insulating layer 305 of the transistor 300 are formed by patterning an ONO film (a multilayer film formed by two silicon oxide films, and a silicon nitride film positioned between them) or the like formed at the same time, so that they are formed of the same material and have approximately the same thickness.

The control gate 116 of the memory cell transistor 110, the upper layer electrode 126 of the select gate transistor 120, the electrodes 206A and 206B of the resistor element 200, and the upper layer electrode 306 of the transistor 300 are formed by patterning a polysilicon film or the like formed at the same time, so that they are formed of the same material and have approximately the same thickness.

The contact plugs 102, 208A, 208B, 308A, and 308B are formed of conductive material such as W (tungsten). A barrier metal may be formed on the bottom surfaces of the contact plugs 102, 208A, 208B, 308A, and 308B.

In the present embodiment, although the memory cell transistor 110 has a floating gate of a two-layer structure including the upper gate electrode 114 and the floating gate 112, the memory cell transistor 110 may have a floating gate of a three or more layer structure. When the floating gate of the memory cell transistor 110 has an N-layer structure (N is an integer of 2 or more), the memory cell transistor 110 includes N−1 IFD films, and the floating gates and the IFD films are alternately stacked.

When the floating gate of the memory cell transistor 110 has an N-layer structure, the resistor element 200 includes N−1 second conductive layers and one first conductive layer on the second conductive layers. The transistor 300 includes N layers of gate electrodes in which all the layers are electrically connected to each other.

Hereinafter, an example of a method of manufacturing the semiconductor device according to the present embodiment will be described.

(Manufacture of Semiconductor Device)

Figure 4A:
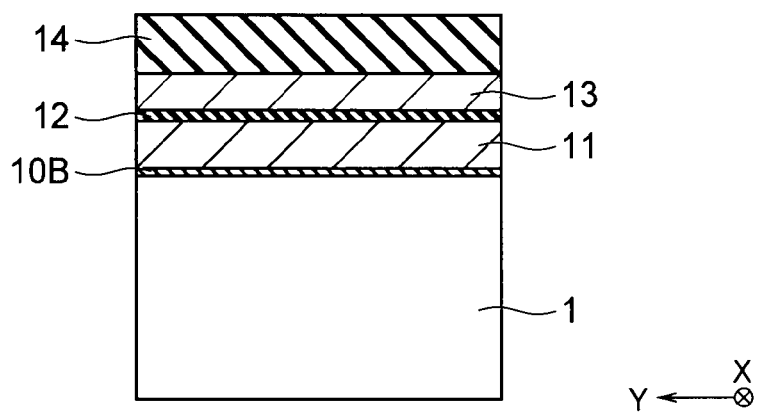
FIGS. 4A to 13C show side sectional views illustrating a manufacturing process of the semiconductor device according to the first embodiment.

FIGS. 4A to 13C show side sectional views illustrating a manufacturing process of the semiconductor device according to the first embodiment. FIGS. 4A, 5A, . . . , and 13A show cross-sections corresponding to the cross-section of FIG. 2A. FIGS. 4B, 5B, . . . ., and 13B show cross-sections corresponding to the cross-section of FIG. 2B. FIGS. 4C, 5C, . . . , and 13C show cross-sections corresponding to the cross-section of FIG. 2C. In this manufacturing method, an example will be described in which the memory cell transistor 110, the select gate transistor 120, and the transistor 300 are n-type transistors.

Figure 4B:
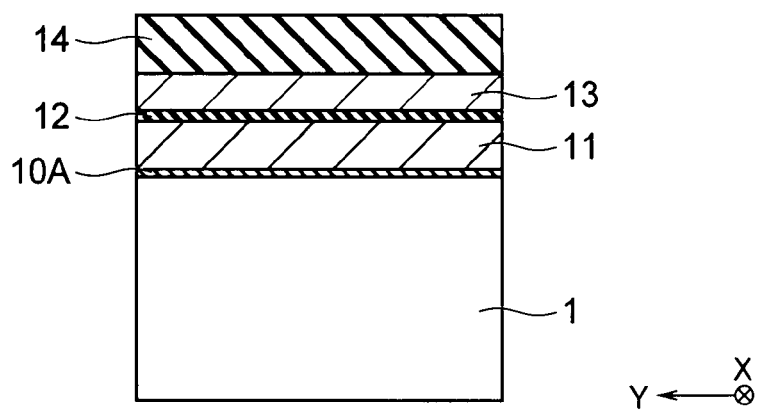
Figure 4C:
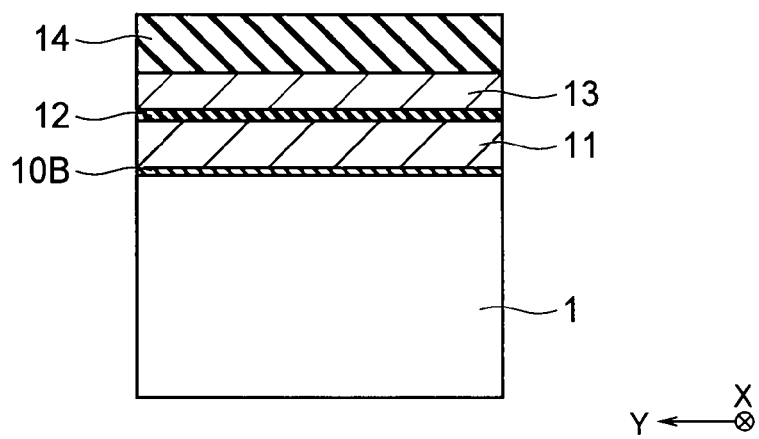

First, as shown in FIGS. 4A to 4C, films 10A, 10B, 11, 12, and 13, and a sacrificial film 14 are formed on the p-type semiconductor substrate 1. Then, p-type impurities are injected into the semiconductor substrate 1, thereby forming a p-well (not shown). The p-well may not be formed.

The film 10A is formed in an area of the resistor element 200 on the semiconductor substrate 1. The film 10B is formed in areas of the non-volatile memory element 100 and the transistor 300 on the semiconductor substrate 1. The film 10A is to be etched into the insulating layer 201 of the resistor element 200 in a later process. The film 10B is to be etched into the tunnel insulator 111 of the memory cell transistor 110, the gate insulator 121 of the select gate transistor 120, and the gate insulator 301 of the transistor 300. In this step, if the film 10A is formed to be thicker than the film 10B, it is possible to effectively prevent charges from passing to the semiconductor substrate 1 by a voltage applied to the first conductive layer 204 of the resistor element 200.

The film 10A is, for example, a silicon oxide film with a thickness of 35 to 40 nm, and is formed by oxidizing the surface of the semiconductor substrate 1. The film 10B is, for example, a silicon oxide film with a thickness of 7 to 9 nm, and is formed by selectively removing a part of an area of the non-volatile memory element 100 in the film 10A, and then oxidizing again the area in the surface of the semiconductor substrate 1.

The film 11 is, for example, a polysilicon film with a thickness of 50 to 80 nm in which high-density n-type impurities are doped, and formed on the films 10A and 10B. The film 12 is, for example, a silicon oxide film with a thickness of 10 nm, and is formed on the film 11. The film 13 is, for example, a polysilicon film with a thickness of 20 to 40 nm in which high-density n-type impurities are doped, and formed on the film 12. The sacrificial film 14 is, for example, a silicon nitride film with a thickness of 50 to 100 nm, and is formed on the film 13.

Figure 5A:
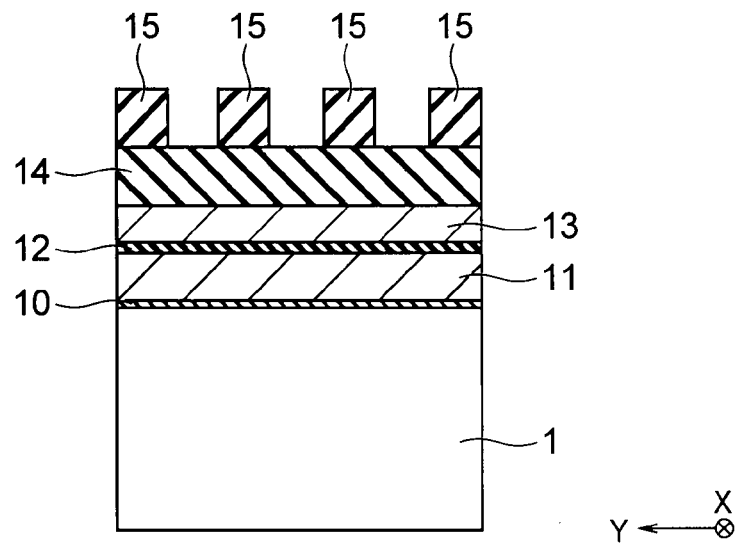
Figure 5B:
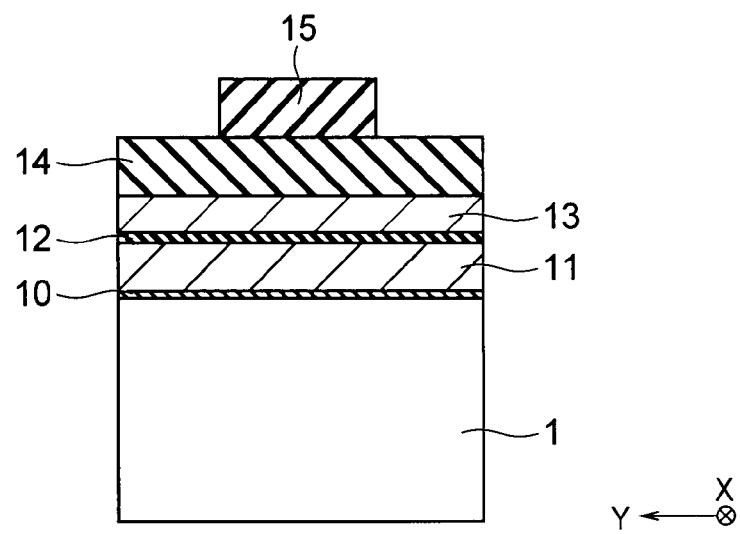
Figure 5C:
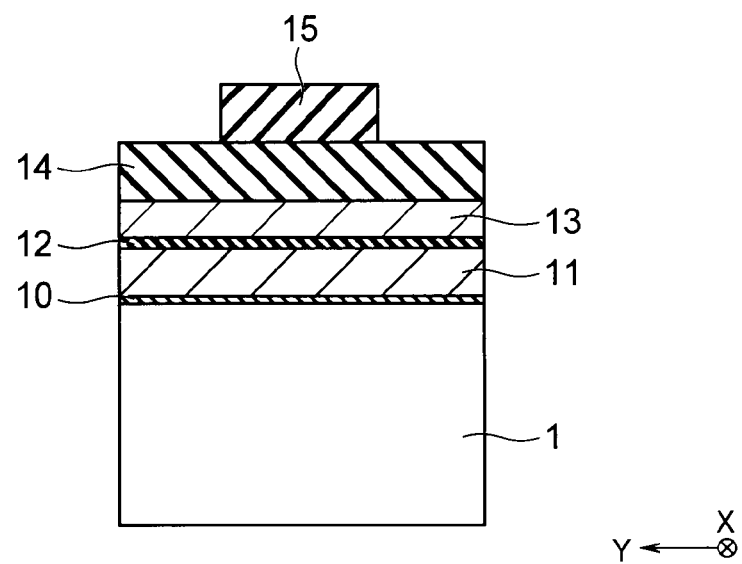

Next, as shown in FIGS. 5A to 5C, a resist mask 15 is formed on the sacrificial film 14 by photolithography. The resist mask 15 has patterns of element areas of the non-volatile memory element 100, the resistor element 200, and the transistor 300. A hard mask may be formed between the sacrificial film 14 and the resist mask 15.

Figure 6A:
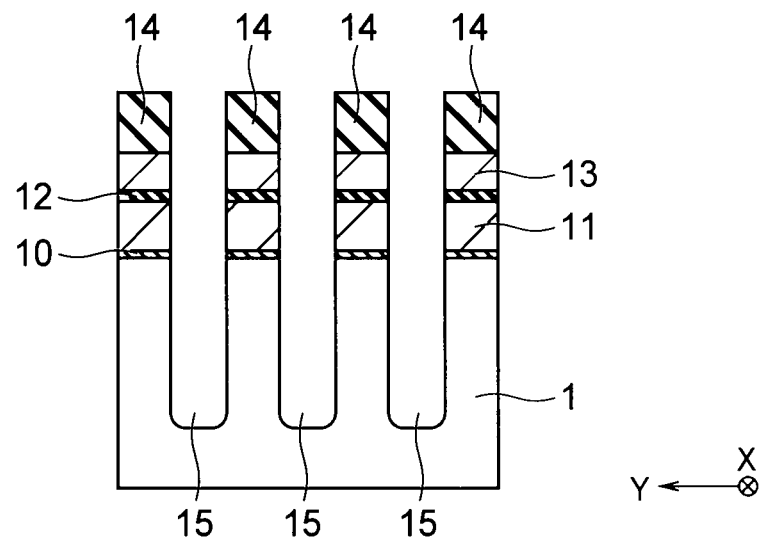
Figure 6B:
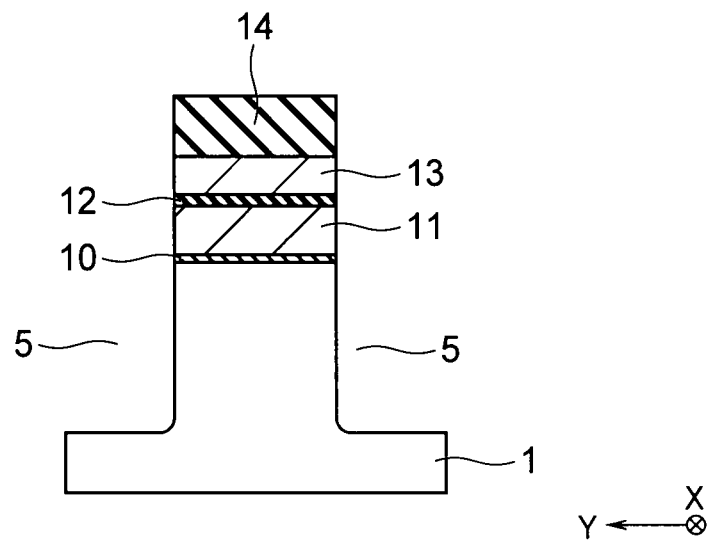
Figure 6C:
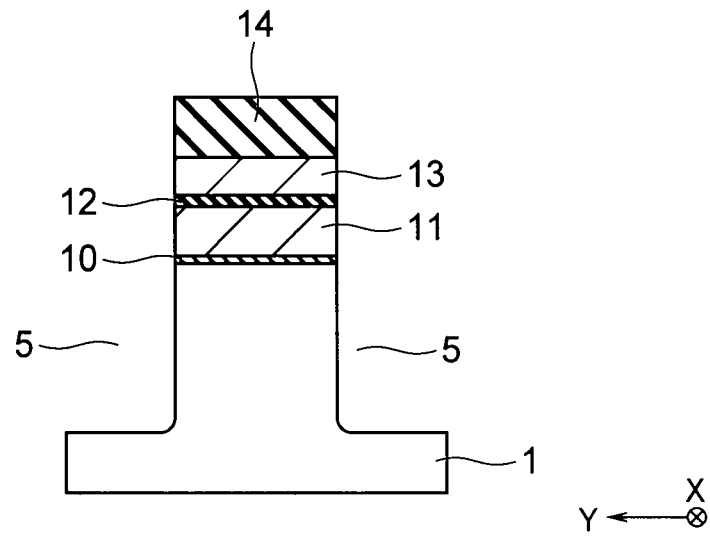

Next, as shown in FIGS. 6A to 6C, the films 13, 12, 11, 10A, and 10B, and the semiconductor substrate 1 are etched by using the resist mask 15 as an etching mask, so that the patterns of the resist mask 15 are transferred to them. In this way, isolation trenches 5 are formed in the semiconductor substrate 1. The etching is performed by RIE (Reactive Ion Etching) or the like.

Figure 7A:
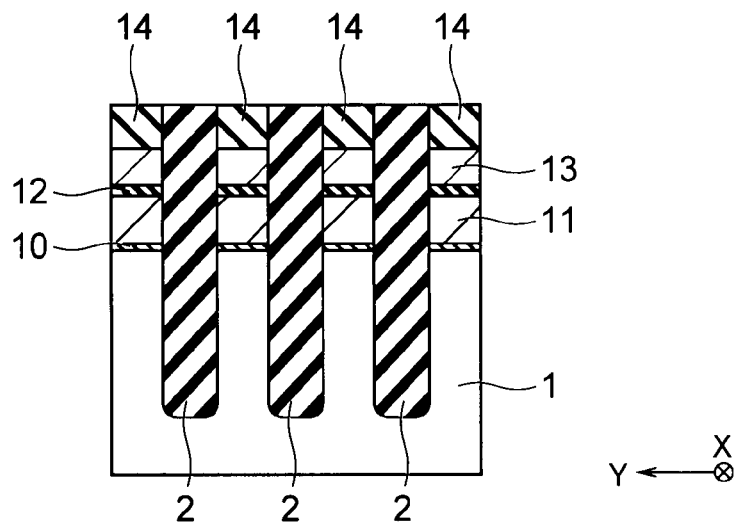
Figure 7B:
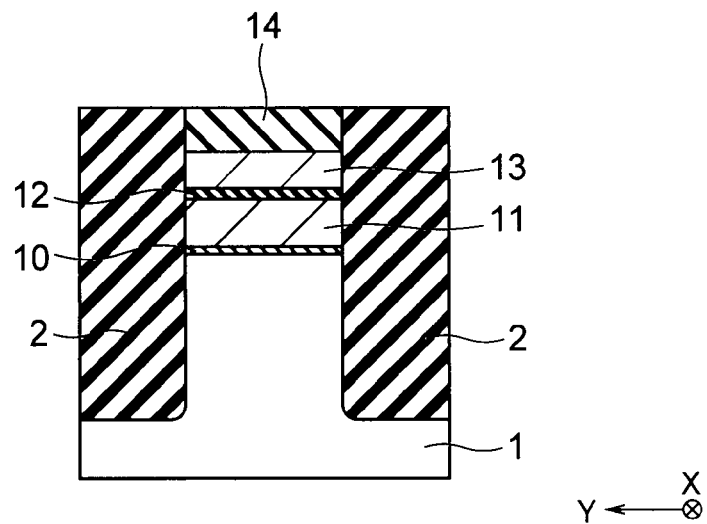
Figure 7C:
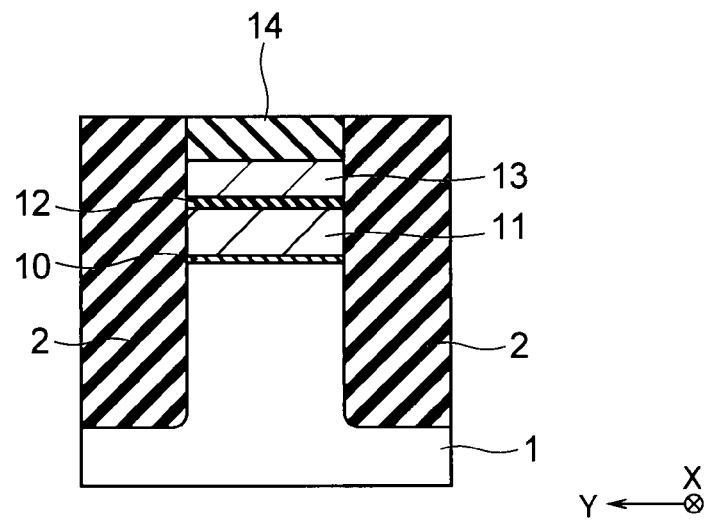

Next, as shown in FIGS. 7A to 7C, the isolation insulators 2 are formed in the isolation trenches 5. The isolation insulators 2 are formed by, for example, depositing insulating material such as oxide silicon on the entire top surface of the semiconductor substrate 1 by CVD (Chemical Vapor Deposition), and then performing CMP (Chemical Mechanical Polishing) on the insulating material by using the sacrificial film 14 as a stopper.

Figure 8A:
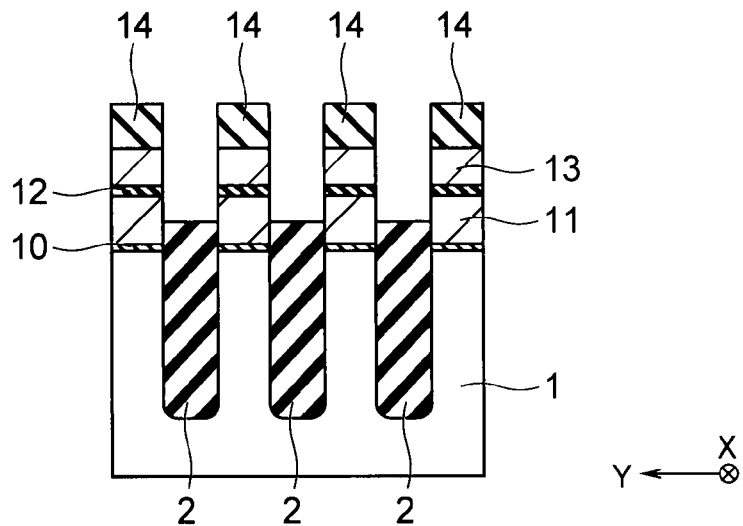
Figure 8B:
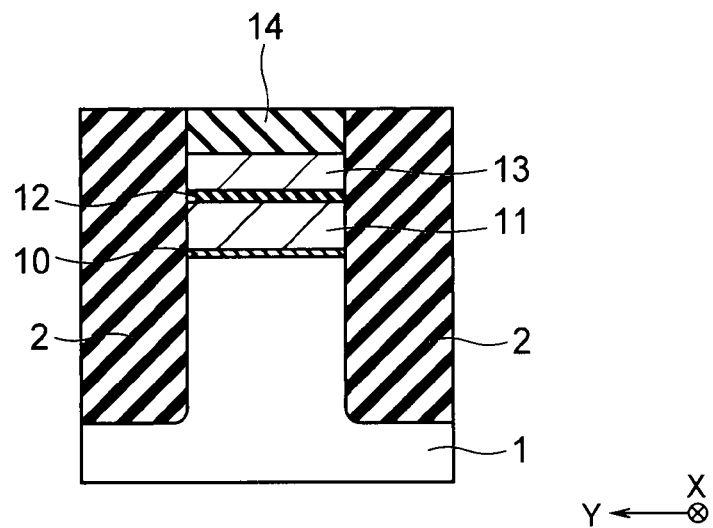
Figure 8C:
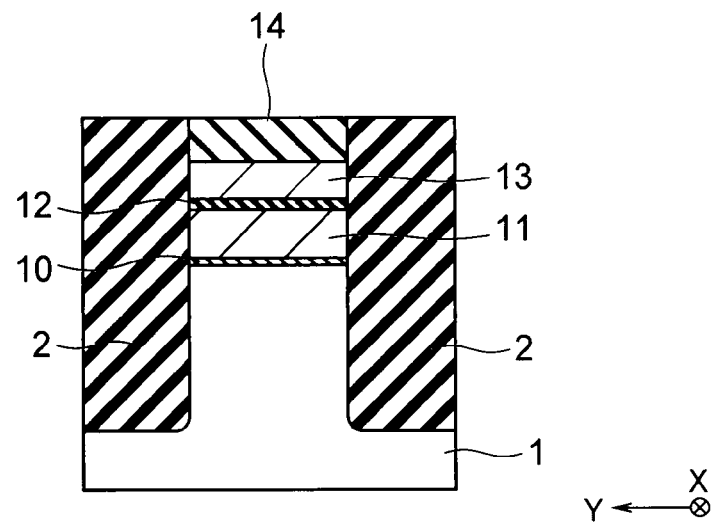

Next, as shown in FIGS. 8A to 8C, the isolation insulators 2 in the area of the non-volatile memory element 100 are selectively etched and the height of the top surfaces is reduced. The height of the top surfaces is set to be higher than the lower surface of the film 11 by 10 to 30 nm. On the other hand, in the areas of the resistor element 200 and the transistor 300, the isolation insulators 2 are not etched. Specifically, when selectively etching the isolation insulators 2 in the area of the non-volatile memory element 100, the areas of the resistor element 200 and the transistor 300 are covered with a resist film or the like so that the isolation insulators 2 in the areas of the resistor element 200 and the transistor 300 are not etched.

Figure 9A:
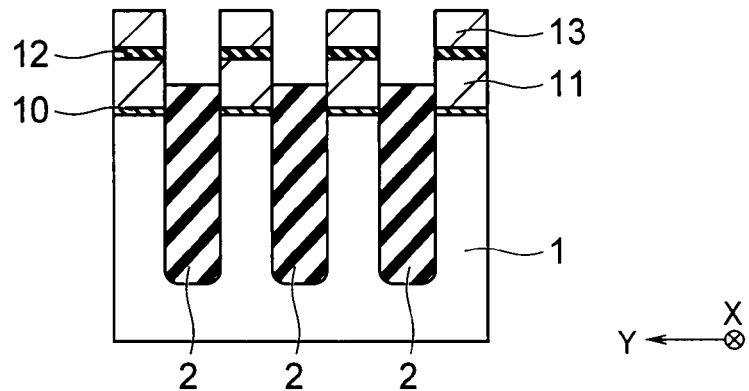
Figure 9B:
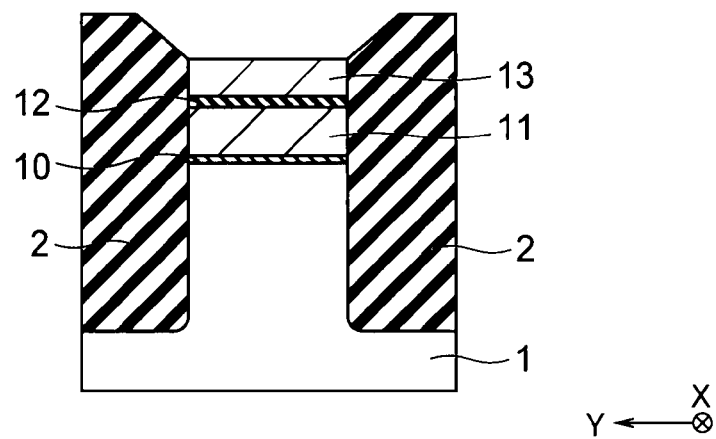
Figure 9C:
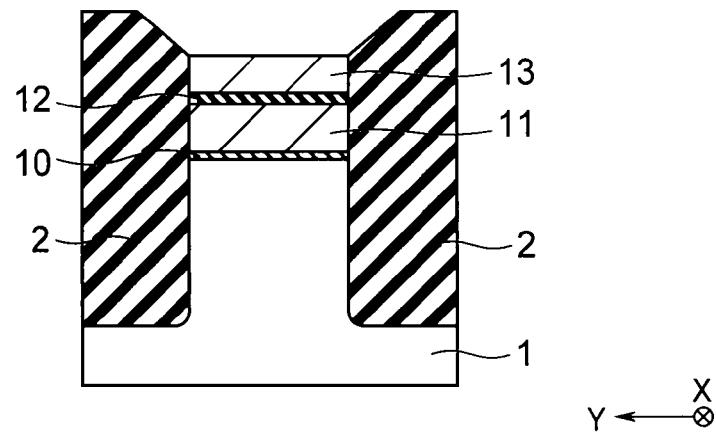

Next, as shown in FIGS. 9A to 9C, the sacrificial film 14 is removed by using heated phosphoric acid or the like.

Figure 10A:
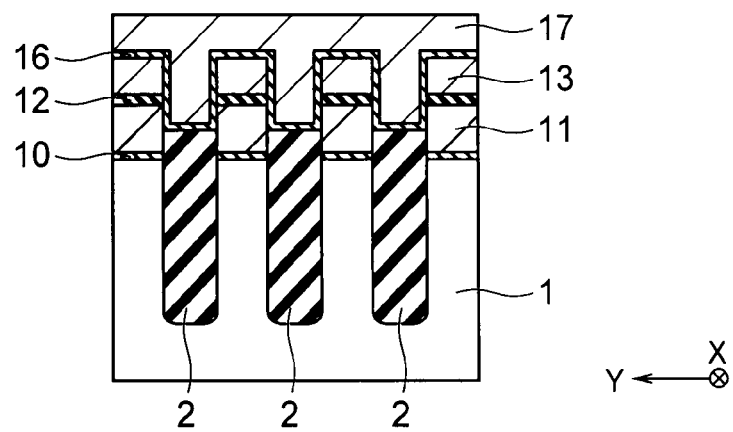
Figure 10B:
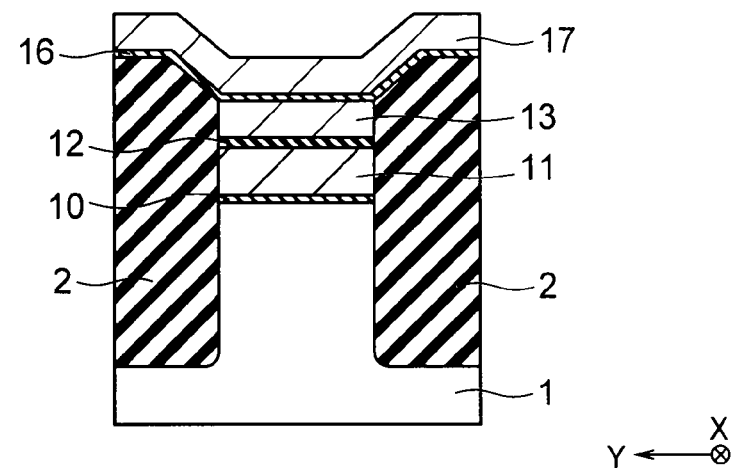
Figure 10C:
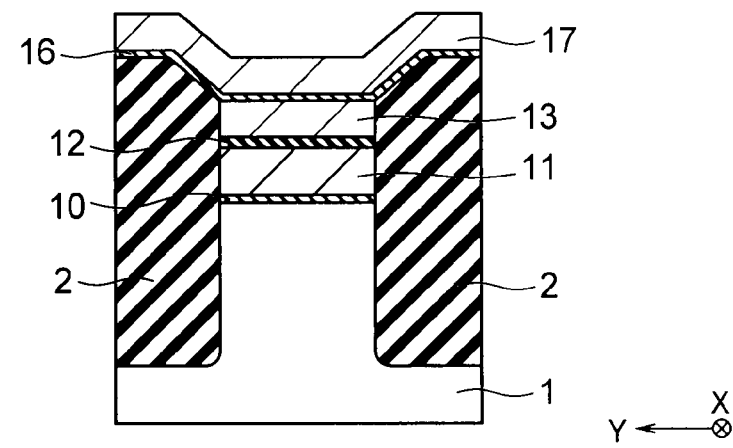

Next, as shown in FIGS. 10A to 10C, films 16 and 17 are formed on the entire top surface of the semiconductor substrate 1.

The film 16 is, for example, an ONO film, and formed to cover the exposed surfaces of the films 11, 12, and 13. As a result, the film 16 is not only formed on the top surface of the film 13, but also continuously formed on the exposed side surfaces of the films 13, 12, and 11, on the top surfaces of the isolation insulators 2. The film 17 is, for example, a polysilicon film in which high-density n-type impurities are doped, and formed on the film 16. As a result, the film 17 is buried between the films 11 adjacent to each other, and between the films 13 adjacent to each other in the Y direction. In other words, the film 17 is in contact with the films 11 and 13 via the film 16.

Figure 11A:
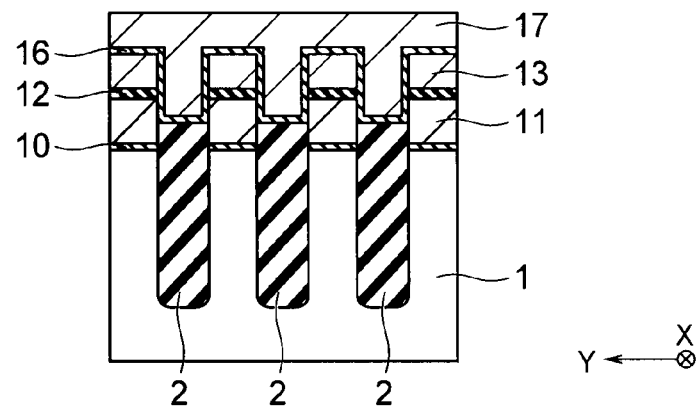
Figure 11B:
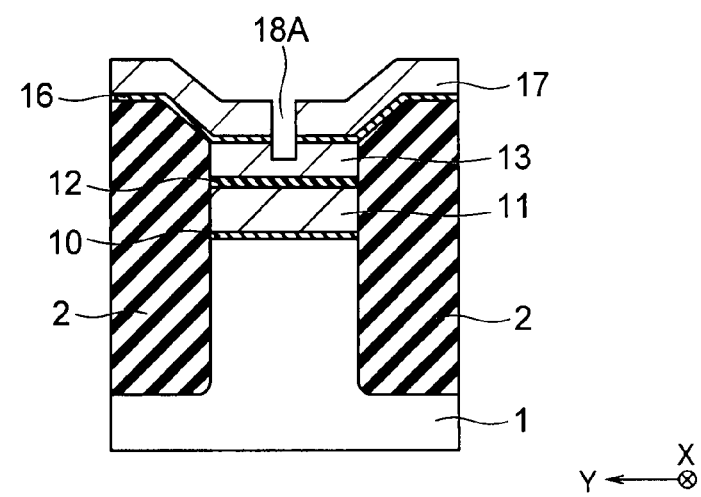
Figure 11C:
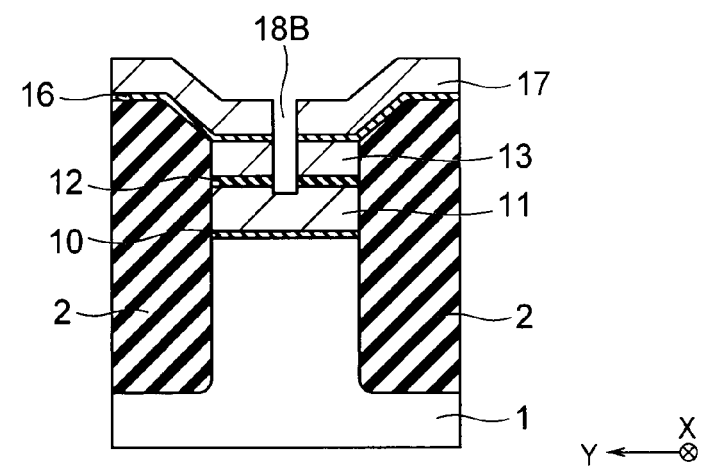

Next, as shown in FIGS. 11A to 11C, the films 17, 16, and 13 of the resistor element 200 and the films 17, 16, 13, 12, and 11 of the transistor 300 are processed by photolithography and etching, so that holes 18A and 18B are formed.

The hole 18A is used for forming the connection part 207A of the electrode 206A, and the height of the bottom surface is between the height of the bottom surface of the film 13 and the height of the top surface of the film 13. The hole 18B is used for forming the connection part 307 of the upper layer electrode 306, and the height of the bottom surface is between the height of the bottom surface of the film 11 and the height of the top surface of the film 11.

The depth of the hole 18A and the depth of the hole 18B are different from each other, so that the holes 18A and 18B are formed by different photolithography processes. By intentionally differentiating the widths of the openings of the holes 18A and 18B, the holes 18A and 18B having different depths can be formed at the same time by using the difference of etching rates. As a result, the photolithography processes can be integrated and the manufacturing process can be simplified.

Although not shown in the figures, a hole, which has the same depth as that of the hole 18A, for forming the connection part 207B of the electrode 206B is formed at the same time as the hole 18A is formed. In the gate electrode of the select gate transistor 120, a hole, which has the same depth as that of the hole 18B, for forming the connection part 127 of the upper layer electrode 126 is formed at the same time as the hole 18B is formed.

Figure 12A:
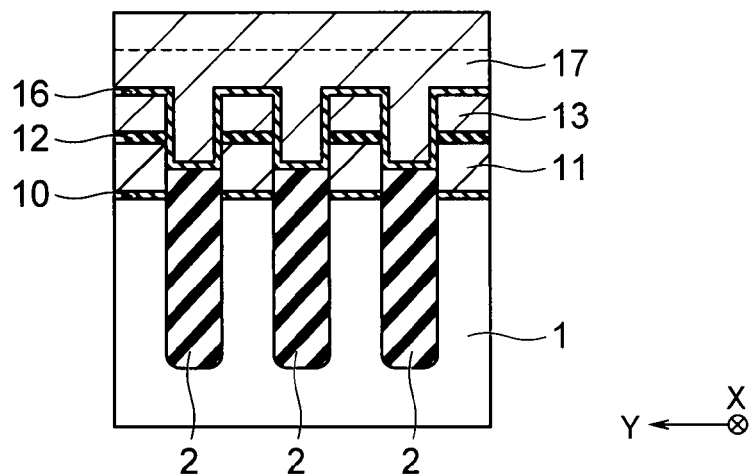
Figure 12B:
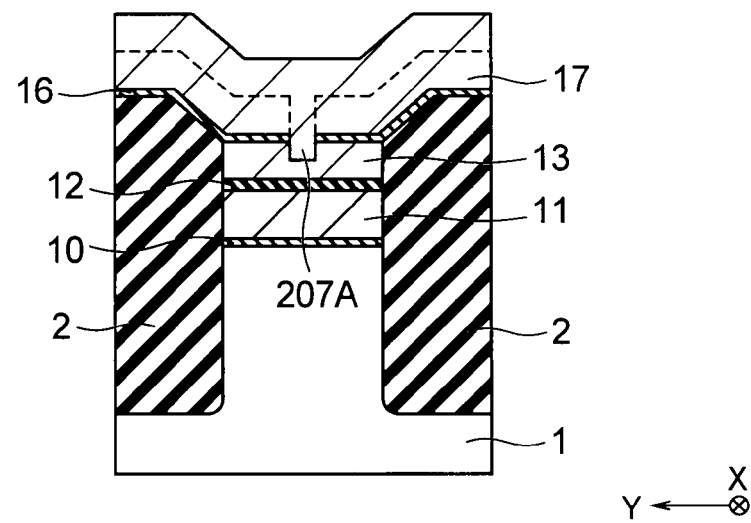
Figure 12C:
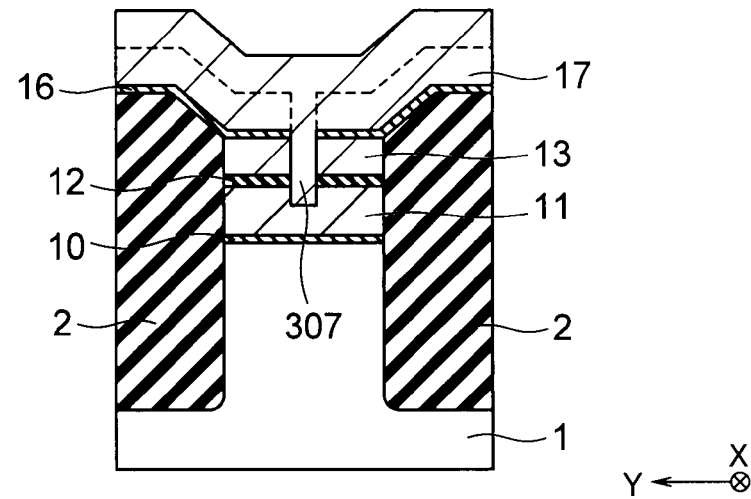

Next, as shown in FIGS. 12A to 12C, the holes 18A and 18B, the hole for the connection part 207B, and the hole for the connection part 127 are filled by depositing, for example, polysilicon on the film 17.

By this process, the thickness of the film 17 increases, and the connection part 127 of the upper layer electrode 126, the connection parts 207A and 207B of the electrodes 206A and 206B, and the connection part 307 of the upper layer electrode 306 are formed.

Figure 13A:
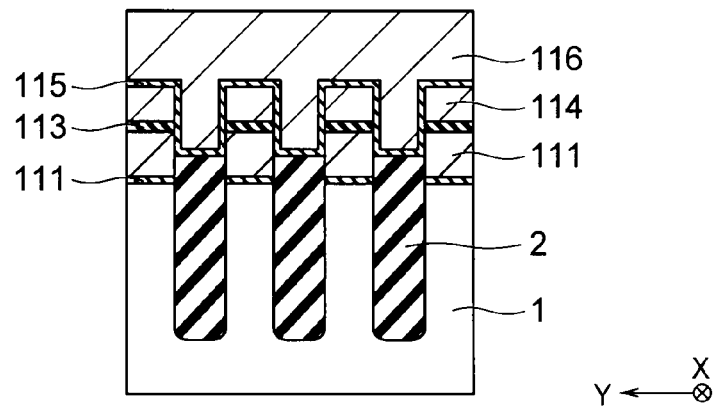

FIG. 13A is a sectional view in which a pattern of the control gate 116 of the memory cell transistor 110 and a gate pattern of the select gate transistor 120 have been transferred to the films 17, 16, 13, 12, 11, and 10.

Figure 13B:
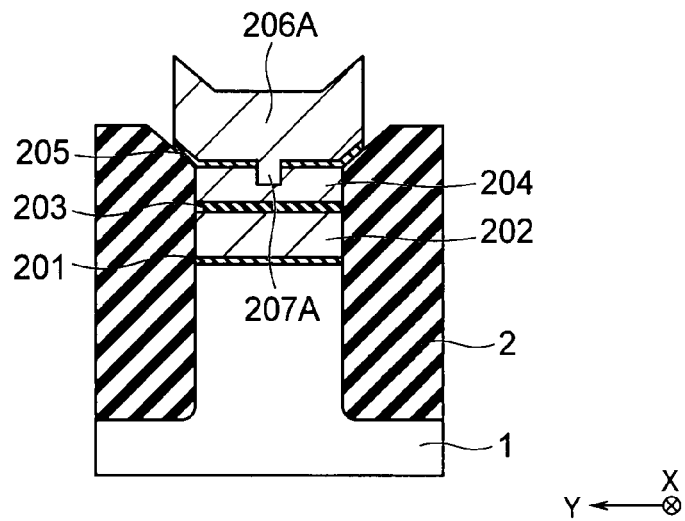

FIG. 13B is a sectional view in which a pattern of the electrode of the resistor element 200 has been transferred to the film 17.

Figure 13C:
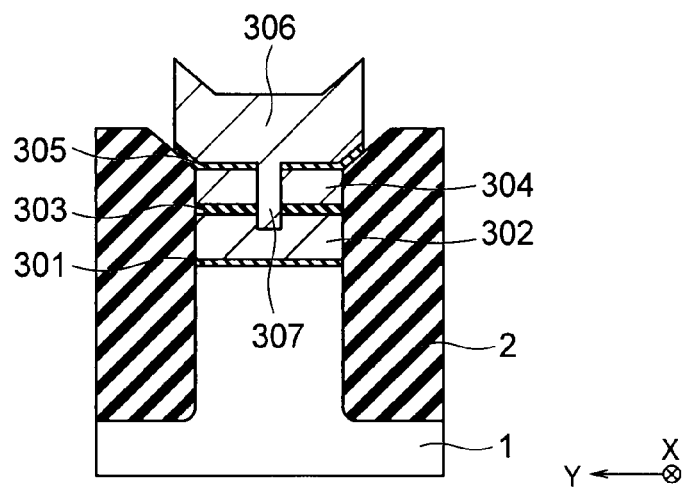

FIG. 13C is a sectional view in which a gate pattern of the transistor 300 has been transferred to the films 17, 16, 13, 12, 11, and 10.

By using these gate patterns, the film 17 is etched into the control gate 116, the upper layer electrode 126, the electrodes 206A and 206B, and the upper layer electrode 306. The film 16 is etched into the IPD film 115, the insulating layer 125, the insulating layer 205, and the insulating layer 305. The film 13 is etched into the upper gate electrode 114, the middle layer electrode 124, the first conductive layer 204, and the middle layer electrode 304. The film 12 is etched into the IFD film 113, the insulating layer 123, the insulating layer 203, and the insulating layer 303. The film 11 is etched into the floating gate 112, the lower layer electrode 122, the second conductive layer 202, and the lower layer electrode 302. The film 10A is etched into the insulating layer 201. The film 10B is etched into the tunnel insulator 111, the gate insulator 121, and the gate insulator 301. This process may be referred to as gate electrode processing.

Then, although not shown in the cross-sections in FIGS. 13A to 13C, n-type impurities are injected into the exposed element areas in the area of the non-volatile memory element 100 and the area of the transistor 300, thereby forming the source and drain regions 101, and the source and drain regions 309, respectively.

As a result, the non-volatile memory element 100, the resistor element 200, and the transistor 300 are completed. Then, the insulating layer 3 is formed on the non-volatile memory element 100, the resistor element 200, and the transistor 300, and then the contact plugs 102, 208A, 208B, 308A, and 308B are formed in the insulating layer 3. Then, interconnects are formed on these contact plugs 102, 208A, 208B, 308A, and 308B.

Second Embodiment

A second embodiment is different from the first embodiment in that the upper gate electrode 114 and the IFD film 113 are not formed.

Figure 14A:
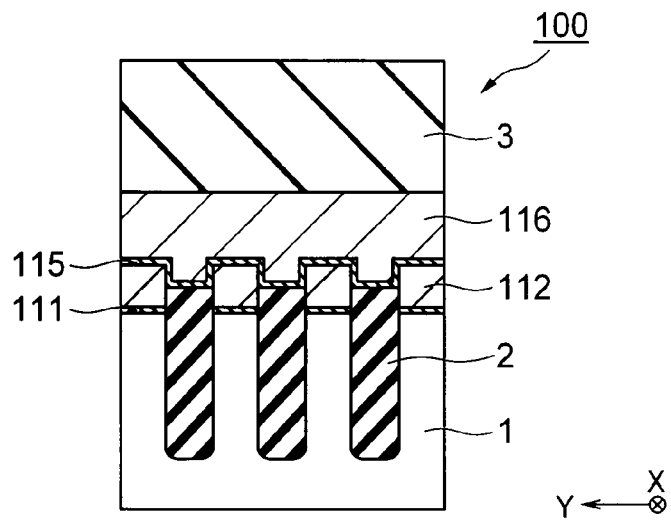
FIGS. 14A to 14C show top views of a non-volatile memory element, a resistor element, and a transistor included in a semiconductor device according to a second embodiment, respectively.
Figure 14B:
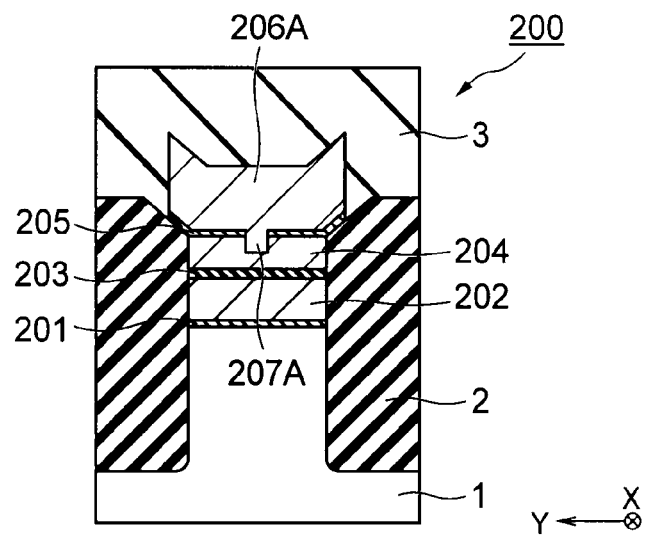
Figure 14C:
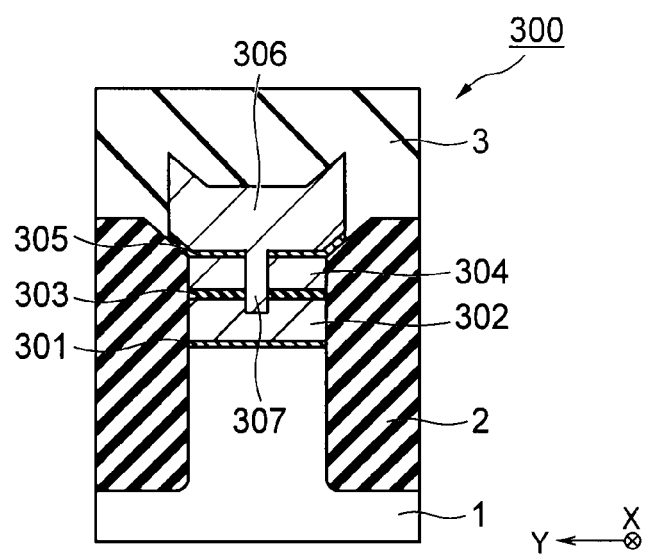

FIGS. 14A to 14C show side sectional views of the non-volatile memory element 100, the resistor element 200, and the transistor 300 included in the semiconductor device according to the second embodiment, respectively. FIGS. 14A to 14C show cross-sections corresponding to the cross-sections shown in FIGS. 2A to 2C.

Figure 15:
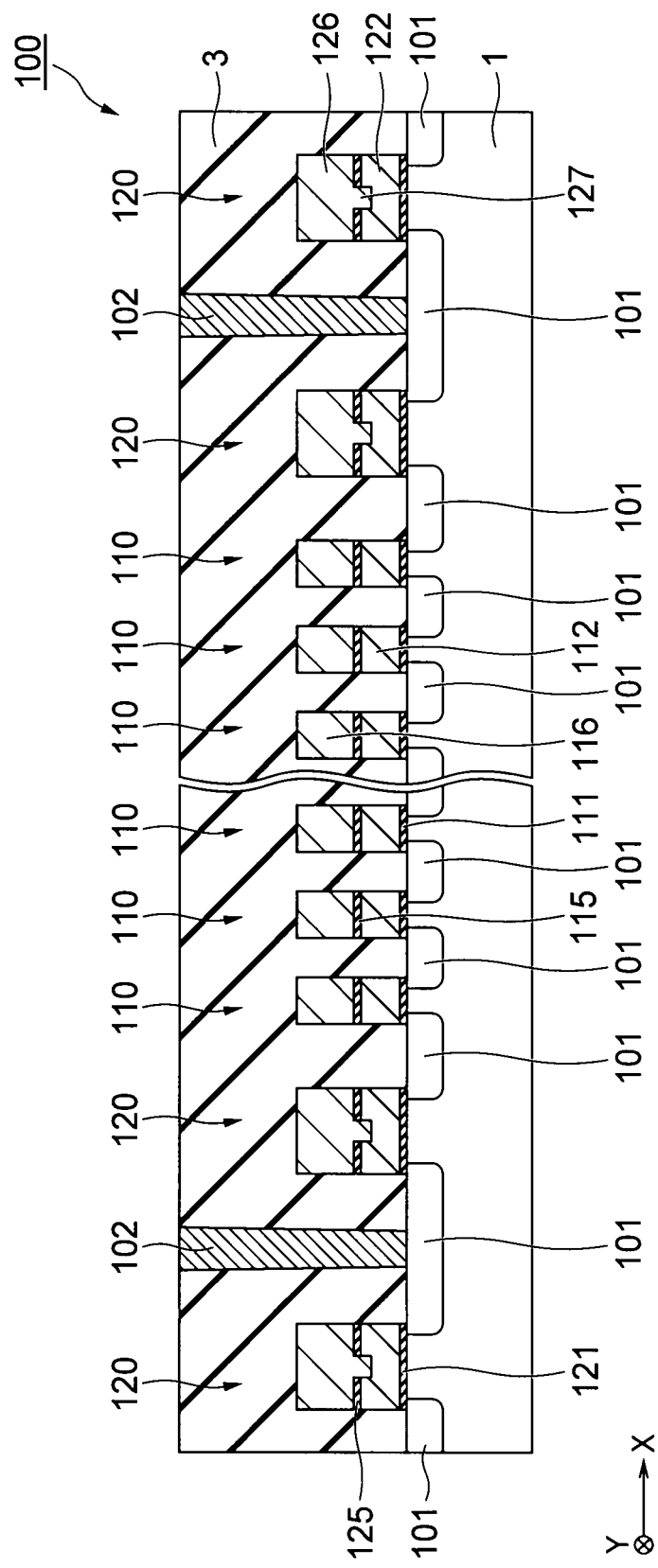
FIG. 15 shows a side sectional view of the non-volatile memory element according to the second embodiment.

FIG. 15 shows a side sectional view of the non-volatile memory element 100 according to the second embodiment. FIG. 15 shows a cross-section corresponding to the cross-section shown in FIG. 3A.

As shown in FIGS. 14A and 15, the memory cell transistor 110 of the non-volatile memory element 100 does not include the upper gate electrode 114 and the IFD film 113, so that the IPD film 115 is directly formed on the floating gate 112. Specifically, in the Y direction, the IPD film 115 is continuously formed on the top surface of the floating gate 112 and the upper side surfaces of the floating gate 112. The select gate transistor 120 does not include the middle layer electrode 124 and the insulating layer 123, so that the insulating layer 125 is directly formed on the lower layer electrode 122.

Even though the upper gate electrode 114 is not included, the thickness of the entire floating gate can be increased by thickening the floating gate 112. In this case, it is also possible to suppress the decrease of the resistance of the resistor element 200, because the thickness of the first conductive layer 204 does not change.

Hereinafter, an example of a method of manufacturing the semiconductor device according to this embodiment will be described.

First, the processes shown in FIGS. 4A to 8C in which the height of the top surfaces of the isolation insulators 2 in the area of the non-volatile memory element 100 is reduced are performed in the same manner as in the first embodiment.

Figure 16A:
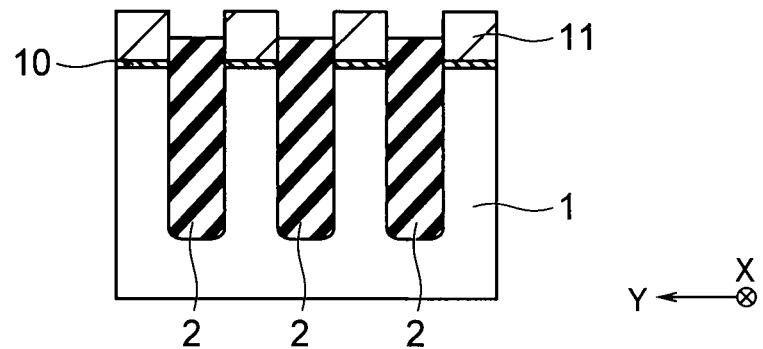
FIGS. 16A to 16C show side sectional views illustrating a manufacturing process of the semiconductor device according to the second embodiment.
Figure 16B:
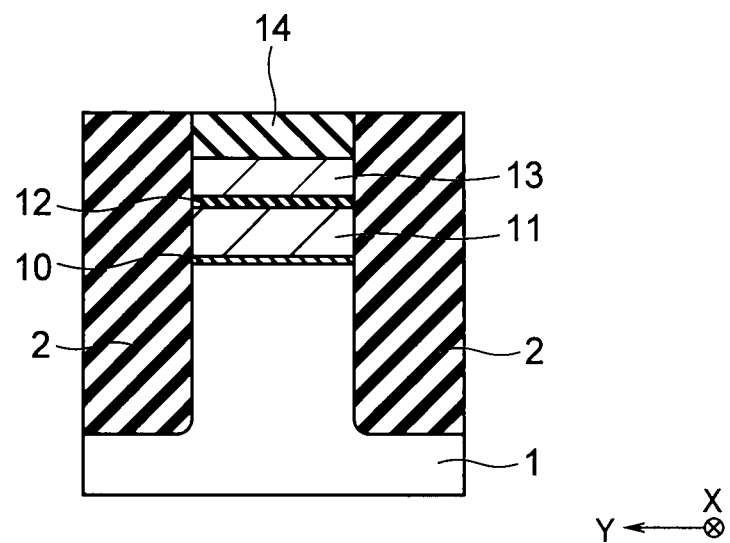
Figure 16C:
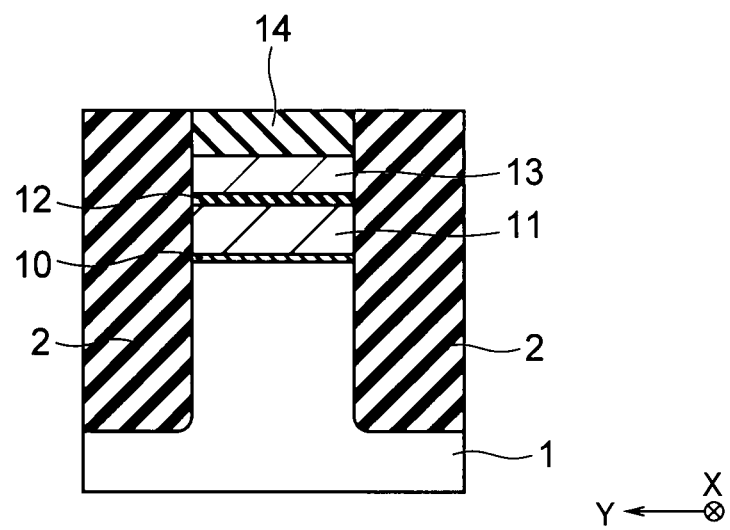

Next, as shown in FIGS. 16A to 16C, the sacrificial film 14 and films 13 and 12 in the area of the non-volatile memory element 100 are removed. By using a condition in which the isolation insulators 2, the sacrificial film 14, and films 13 and 12 can be etched at the same time, the etching of the isolation insulators 2 and the removal of the sacrificial film 14 and films 13 and 12 may be performed at the same time.

Then, the processes for removing the sacrificial film 14 in the area of the resistor element 200 and the area of the transistor 300 and forming the film 16 and the following processes are performed in the same manner as in the first embodiment.

Effects of the Embodiments

According to the first and the second embodiments, even though the floating gate 112 of the memory cell transistor 110 is formed to be thick, the thickness of the first conductive layer 204 that functions as a resistor of the resistor element 200 does not increase. With this arrangement, even though increasing the thickness of the floating gate 112 in order to increase a coupling ratio between the control gate and the floating gate of the memory cell transistor 110, the resistance of the resistor element 200 does not decrease. As a result, the length of a resistive body of the resistor element 200 need not be long.

In other word, the thickness of a resistive part of the resistor element in a peripheral circuit and the thickness of the floating gate of the memory cell transistor can be independently set. As a result, the coupling ratio of the memory cell transistor 110 can be increased without increasing the element area of the resistor element.

According to the second embodiment, the IFD film 113 is formed not only on the upper side surface of the floating gate 112 but also on the top surface of the floating gate 112. As a result, the coupling ratio can be further improved.

In the X direction, the height of the gate electrode of the memory cell transistor 110 can be reduced by the sum of the thicknesses of the IFD film 113 and the upper gate electrode 114. As a result, in the gate electrode processing as shown in FIGS. 13A to 13C, it is easy to etch the gate electrode of the memory cell transistor 110.

The disclosure is not limited to the first and the second embodiments, and various modifications can be implemented without departing from the scope of the present invention. For example, although the non-volatile memory element 100 which is a NAND memory element is used in the first and the second embodiments, another type of non-volatile memory element which includes a stacked-gate type cell transistor may be used. A memory element, which does not include a select gate transistor, such as an NOR type memory element may be used as a non-volatile memory element.

The sequence of processes in the manufacturing process of the semiconductor device described herein is not limited to those described in the first and the second embodiments.

As described above, according to the embodiments described herein, it is possible to provide a semiconductor device and a method of manufacturing the same in which the thickness of the resistive part of the resistor element in the peripheral circuit and the thickness of the floating gate of the memory cell transistor can be independently set.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

The invention claimed is:
1. A semiconductor device comprising:
a resistor element including a first conductive layer which is formed on a second conductive layer via a first insulating layer, and is electrically connected to an interconnect, the second conductive layer being on a substrate and being electrically insulated from the first conductive layer; and
a stacked-gate type memory cell transistor which is on the substrate, and includes a floating gate formed of the same material as the second conductive layer, an upper gate electrode formed on the floating gate via a second insulating layer, and an control gate formed on the upper gate electrode via a third insulating layer, the upper gate electrode being formed of the same material as the first conductive layer and being electrically insulated from the floating gate and the control gate.

2. The device of claim 1, wherein the second conductive layer is formed on the substrate via a fourth insulating layer.

3. The device of claim 1, wherein the floating gate is formed on the substrate via a tunnel insulator.

4. The device of claim 3, wherein a thickness of the tunnel insulator is equal to or greater than 3 nm in equivalent silicon oxide thickness.

5. The device of claim 3, wherein the tunnel insulator is a Fowler-Nordheim (FN) tunnel film.

6. The device of claim 3, wherein
a thickness of the second insulating layer is greater than a thickness of the tunnel insulator in physical thickness.

7. The device of claim 1, wherein a thickness of the second conductive layer is 50 to 80 nm.

8. The device of claim 1, wherein a thickness of the first conductive layer is 20 to 40 nm.

9. The device of claim 1, further comprising:
a peripheral circuit transistor which is on the substrate, and comprises a gate electrode including a first electrode formed of the same material as the second conductive layer, and a second electrode formed on the first electrode, electrically connected to the first electrode, and formed of the same material as the first conductive layer.

* * * * *